United States Patent [19]

Imai et al.

[11] Patent Number: 4,473,755
[45] Date of Patent: Sep. 25, 1984

[54] DEVICE FOR PREVENTING NOISE LEAKAGE AND MANUFACTURING METHOD OF THE DEVICE

[75] Inventors: Iwao Imai; Hiroshi Endo; Masazumi Sone; Hideo Kasuya, all of Yokosuka, Japan

[73] Assignee: Nissan Motor Company, Limited, Yokohama, Japan

[21] Appl. No.: 366,661

[22] Filed: Apr. 8, 1982

[30] Foreign Application Priority Data

Apr. 10, 1981 [JP] Japan ................................. 56-52913

[51] Int. Cl.$^3$ .......................... B62D 43/00; H05K 3/34
[52] U.S. Cl. ............................. 307/10 R; 364/431.03; 381/86; 381/94; 455/297
[58] Field of Search .................. 29/840, 882; 333/181, 333/182, 183, 184; 339/17 LM, 17 CF, 17 M, 176 MF, 147 R, 176 MP; 361/399, 403, 424; 307/10 R, 91; 364/431.03; 381/86, 94; 455/297

[56] References Cited

U.S. PATENT DOCUMENTS

| | | | |
|---|---|---|---|
| 3,818,349 | 6/1974 | Ma | 361/424 X |
| 4,126,840 | 11/1978 | Selvin | 339/147 R X |
| 4,325,103 | 4/1982 | Ito et al. | 361/424 |
| 4,370,700 | 1/1983 | Duddles et al. | 361/399 X |

Primary Examiner—Howard N. Goldberg
Assistant Examiner—Carl J. Arbes

Attorney, Agent, or Firm—Schwartz, Jeffery, Schwaab, Mack, Blumenthal & Koch

[57] ABSTRACT

A device for preventing noise leakage externally from a digital electronic apparatus using a clock pulse generator, comprising: (a) a metal casing; (b) a printed circuit board housed within the metal casing into which the digital electronic apparatus is assembled having a plurality of land patterns formed thereon at the end of various signal lines of the digital electronic apparatus; (c) a connector attached at one end of the printed circuit board having a plurality of connector pins therewithin for connecting said land patterns with external various apparatus; (d) an insulative film positioned on one surface of the printed circuit board closely adjacent to the land patterns; (e) a conductive film coated on one surface of the insulative member and coupled electrically to the metal casing; and (f) a plurality of chip-type capacitors which bridges between the conductive film and plurality of land patterns for effecting noise filtering and a method of manufacturing the device described above comprising the steps of: (a) coating a solder-resisting film on the conductive film except a portion to which the chip-type capacitors are connected and a portion to which the metal casing is electrically connected; (b) electrically connecting the conductive film to the plurality of chip-type capacitors to the land patterns in a soldering with a solder bath; and (c) electrically connecting the conductive film to the metal casing.

10 Claims, 9 Drawing Figures

DEVICE FOR PREVENTING NOISE LEAKAGE AND MANUFACTURING METHOD OF THE DEVICE

BACKGROUND OF THE INVENTION

(1) Field of the Invention

The present invention relates to a device for preventing noise generated from digital electronic apparatus from interfering with audio equipment and, more particularly, the invention relates to a noise preventing device for electronic apparatus of an automotive vehicle and to preventing interfering with or disturbing audio equipment thereon, such as a radio. The invention also pertains to a method of manufacturing the device.

(2) Description of the Prior Art

Recently digital electronics and microcomputers have been used in various types of consumer products, e.g., clocks, timers, and electric home appliances.

On the other hand, in the field of automotive vehicles electronic technology has been put into practice for controlling internal combustion engines and various types of electric appliances mounted in the automotive vehicle using digital wired logic circuitry or microcomputers.

In such a microcomputer-based electronic control system for the automotive vehicle, a metallic casing is provided for shielding the power supply and digital circuitry including the microprocessor, clock oscillator, memory unit, input/output interface and control circuits connected between the microprocessor and I/O interface. Such a metallic casing is installed below the instrument panel or seat where environmental conditions, e.g., temperature and humidity are relatively favorable within the vehicle and where input/output signal lines externally wired from the digital circuitry serve to transmit input signals from various types of sensors for calculating control parameters and output signals from the I/O interface for controlling the internal combustion engine, various electric appliances, and actuators, etc.

The frequency of the input/output signals to be transmitted through the input/output signal lines ranges from zero to several tens of kilohertz (kHz). In addition, for these input/output signal lines and power supply lines vinyl-coated wires are usually used and bundled with a set of harnesses to other electrical appliances. Because the wiring of the input/output signal lines is carried out in such a way as described above, the input/output signal lines are closely coupled to a set of harnesses for connecting radio equipment to the antenna. As a result, these input/output signal lines are coupled to the antenna harness by mutual inductance and electromagnetic radiation in the high-frequency range. Furthermore, since the vehicle battery is used as a common DC power supply of the digital circuitry and other electrical appliances and a vehicle body is used as a common ground of these pieces of vehicle equipment it is apparent that these pieces of vehicle equipment are conductively coupled to each other.

On the other hand, rectangular clock pulses with a frequency between several hundred kilohertz and several kilohertz are used for synchronization control signals of the digital electronic equipment, e.g., microcomputer. These signals comprise a basic wave with an amplitude of several volts and high harmonic components thereof. Each frequency of the high harmonic components is distributed over a wide range, i.e., from an AM band to an FM or TV band. Therefore, such a rectangular clock pulse may be deemed to be a kind of noise source. A leakage of high-frequency noise components of the clock pulse from the digital circuitry into the input/output signal lines and power supply lines and a direct and indirect coupling of the input/output signal lines and power supply lines to the radio harness and antenna cause the signal-to-noise ratio of the radio equipment to be reduced and causes beat interference in the radio equipment. Consequently, the quality of reception of an audio signal is reduced. A filter element for bypassing high-frequency waves is inserted as a noise interference device between each input/output signal line and the power supply line connected to all digital equipment and furthermore electrically connected to a ground conductor patterned on a printed circuit board which is electrically connected to a vehicle body or metallic casing of the equipment.

However, since such an earth conductor is needed on a lower surface of the printed circuit board (lower surface means one surface of the printed circuit board where metal foil patterns are regularly formed and soldered) it is difficult to connect a connector pin to a printed power supply line, power supply line, and ground line on its lower surface. If such a filter element is assembled on a separate printed circuit board, the order of assembly is facilitated and the ground conductor may cover a wide space so as to have a filtering effect on noise propagation. However, this arrangement reduces the effect of inserting the filters when many lines are required for connecting the input/output signal lines to the filter and requires extra spaces for these lines and filters.

SUMMARY OF THE INVENTION

With the above-described problem in mind, it is an object of the present invention to provide a compact device for preventing noise radiation for digital equipment, exhibiting a sufficient performance of the filter element group for preventing the propagation of high-frequency noise components into various signal lines of other electrical appliances and disturbing the flexibility of pattern design for the printed circuit board.

It is another object of the present invention to provide a manufacturing method of the device described above.

BRIEF DESCRIPTION OF THE DRAWINGS

The features and advantages of the present invention will be appreciated from the foregoing description taken in conjunction with the attached drawings in which like reference numerals designate corresponding elements and in which.

DETAILED DESCRIPTION OF THE PREFERRED EMBODIMENTS

Reference will hereinafter be made to the attached drawings and first FIG. 1 which shows a circuit configuration of a digital electronic control system, e.g., engine controlling system for an automotive vehicle.

Figure 1:
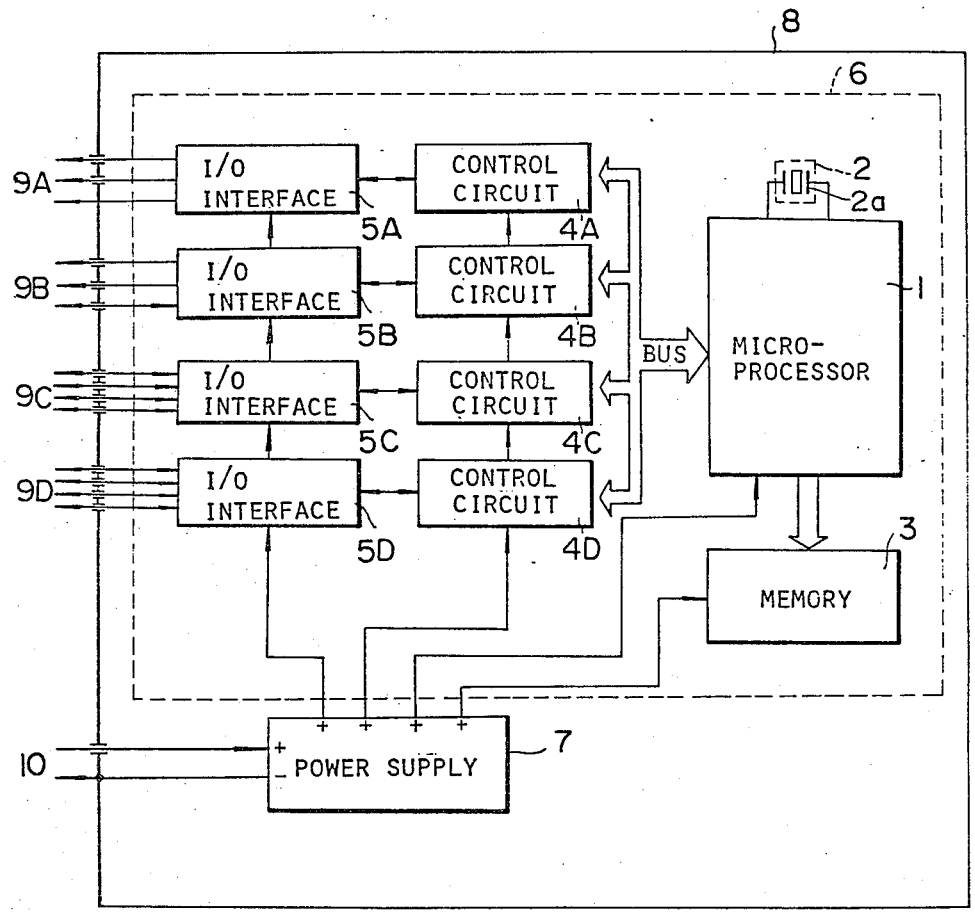
FIG. 1 is a simplified block diagram showing a digital electronic apparatus mounted in an automotive vehicle.

In FIG. 1, numeral 1 denotes a microprocessor, numeral 2 denotes a clock pulse generator using a quartz oscillator 2a which produces a clock pulses, and numeral 3 denotes a memory, e.g., ROM (Read Only Memory) and/or RAM (Random Access Memory). The microprocessor 1 receives the clock pulses from the clock pulse generator 2 and provides additional clock and timing signals having pulse widths, for example, of several nanoseconds to several ten's of nanoseconds. Numerals 4A through 4D denote control circuits which may include counters and trigger circuits for controlling fuel injection, ignition timing etc. Numerals 5A through 5D denote microprocessor interface circuits for interfacing between external circuits and the control circuits and microprocessor 1. The interface circuits may include A/D converters, D/A converters, signal shapers, level converters, multiplexers, etc. Timing pulses from the microprocessor 1 are fed into the memory 3, control circuits 4A-4D, and interface circuits 5A-5D for synchronizing same with the microprocessor 1. A digital circuit block 6 is housed in a metallic casing 8 together with a power supply 7. Numerals 9A through 9D denote input/output signal lines. Numeral 10 denotes a DC power supply line.

Figure 2:
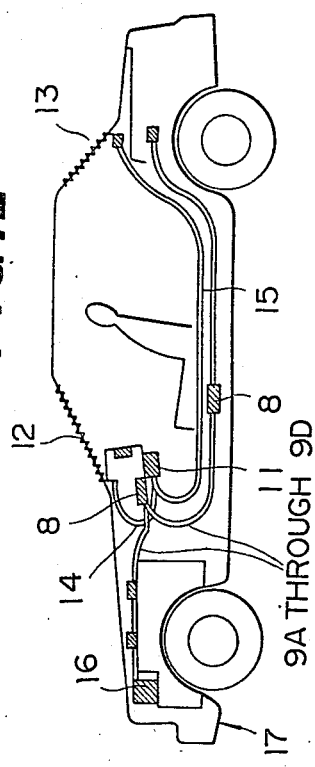
FIG. 2 is a wiring diagram showing an example of an electronic apparatus and electric appliances which are installed within an automotive vehicle.

As shown in FIG. 2, each metallic casing 8 is installed under an instrument panel, or seat where environment conditions, e.g., temperature and humidity are relatively favorable (stable and moderate) within a vehicle compartment. The input/output signal lines 9A through 9D provide means for transmitting the input signals from a variety of sensors for calculating control parameters and output signals for controlling the actuators and various kinds of electric appliances.

The frequency of these signals transmitted through these input/output signal lines ranges from zero to several ten kilohertz. These signal lines and power supply lines use normally vinyl-tube wires and are bundled in a harness containing wires for other electric appliances so as to arrange properly the wiring within the vehicle. Because of such a wiring state, the input/output signal lines connected with such a digital electronic apparatus are coupled in an extremely close state due to induction or electromagnetic radiation in the high-frequency range with the harness of other electric appliances, e.g., harness 14, 15 for connecting a radio equipment 11 to an antenna 12, 13. Since the same battery 16 is used as a DC power supply between the digital electronic apparatus and other electrical appliances and a vehicle body 17 is used as a common ground, a direct conductive coupling is made between the digital electronic apparatus and ground lines through such power supply lines and ground lines.

In the automotive vehicle where the digital electronic apparatus is mounted, the reduction is SN ratio of audio equipment such as a radio and the beating by interference with noise is brought about due to the leakage of high-frequency noise components of the clock pulse from the digital circuit block 6 into the input/output signal lines 9A through 9D and power supply lines 10.

Figure 3:
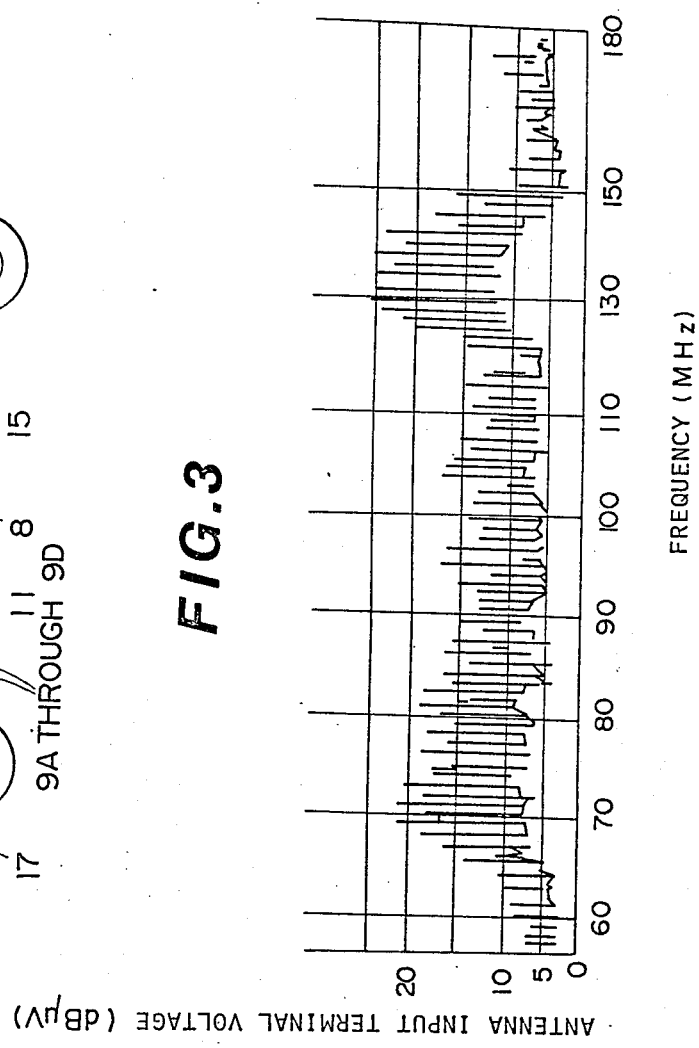
FIG. 3 is a frequency spectrum showing a measurement of noise generated from a conventional digital electronic apparatus in which a noise interference preventing device is not installed.

FIG. 3 shows a frequency spectrum of noise generated by the digital electronic apparatus such as digital circuit block 6 for an automotive vehicle (using a clock pulse generator having a frequency of 1 MHz) by measuring the input voltage of the antenna terminal of the audio equipment (intermediate frequency bandwidth 10 KHz) using a field strength measuring instrument. In this drawing, the horizontal axis shows the frequency in MHz and the vertical axis shows the voltage in dB $\mu$V. A large fluctuation is generated over a wide frequency range at the antenna input terminal as shown in FIG. 4 and indicates noise generated by the digital electronic apparatus.

Figure 4:
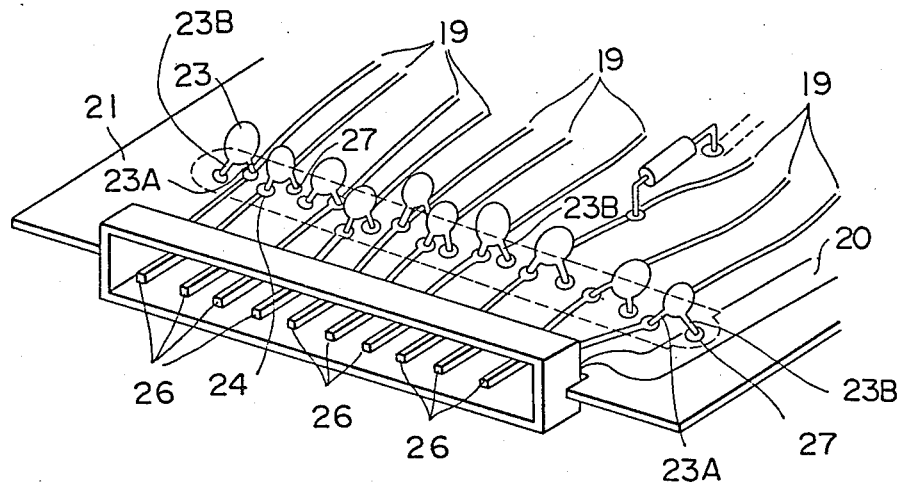
FIGS. 4 and 5 are perspective views showing two conventional noise interference preventing devices equipped with automotive vehicle digital electronic apparatus.

FIG. 4 shows an example of a conventional noise interference preventing device used in the automotive vehicle and comprises a plurality of capacitors 23.

In FIG. 4, numeral 19 denotes input/output signal lines and power supply lines and numeral 20 denotes a ground line. The ground line 20 is connected to the ground conductor 22 attached on a lower surface of a printed circuit board 21 and grounded at the connector. Numeral 24 denotes a connecting hole provided at each end of the input/output signal lines patterned on the PCB (abbreviation for Printed Circuit Board). Each input/output signal line 19 is connected to each connector pin 26 for bridging a connector 25 with the input/output signal line 19. Furthermore, among two legs 23A and 23B provided at each capacitor 23, the leg 23A is connected to the hole 24 and the other leg 23B is connected to the earth conductor 22 provided at the lower surface of the PCB 21 via the connecting hole 27.

However, since the ground conductor 22 is attached on the lower surface of the PCB 21 in the noise interference preventing device constructed as shown in FIG. 4, it is difficult to connect additional input/output lines, supply lines and ground lines with the connector pins 26 at the lower surface thereof so as not to intersect the ground conductor 22. Therefore, such a noise interference preventing device is used only in the printed circuit board where the printed wires 19 are formed on the upper surface.

Figure 5:
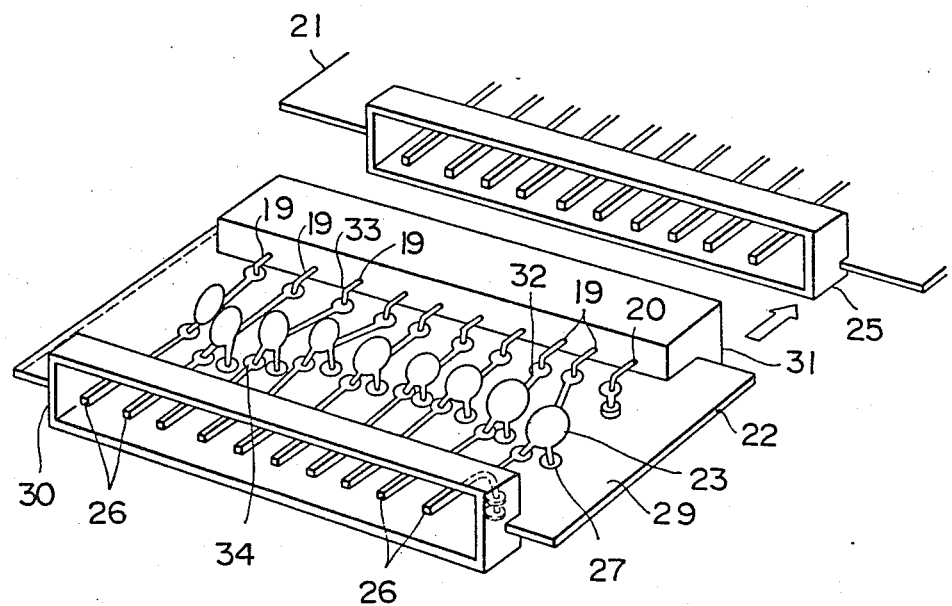

FIG. 5 shows another example of the conventional noise interference preventing device.

In this example, a ground conductor 22 is formed of a separate filter board 29 without direct installation on the PCB 21. The connector pin 26 and capacitor filter 23 are connected to the ground line 20 and the ground conductor 22 is connected to the capacitor filter 23. The ground conductor 22 covers substantially the entire bottom surface of the filter board 29.

Numeral 32 denotes a metal foil pattern for connecting an end 33 of each input/output signal line 19 with and end 34 of each connector pin 26. The order of assembly is facilitated if the noise interference device is arranged on a separate board.

However, the noise interference preventing device of the construction described above causes an increase in cost and the complicated form of the input/output signal lines 19 results in a reduction of the filtering effect.

Figure 6:
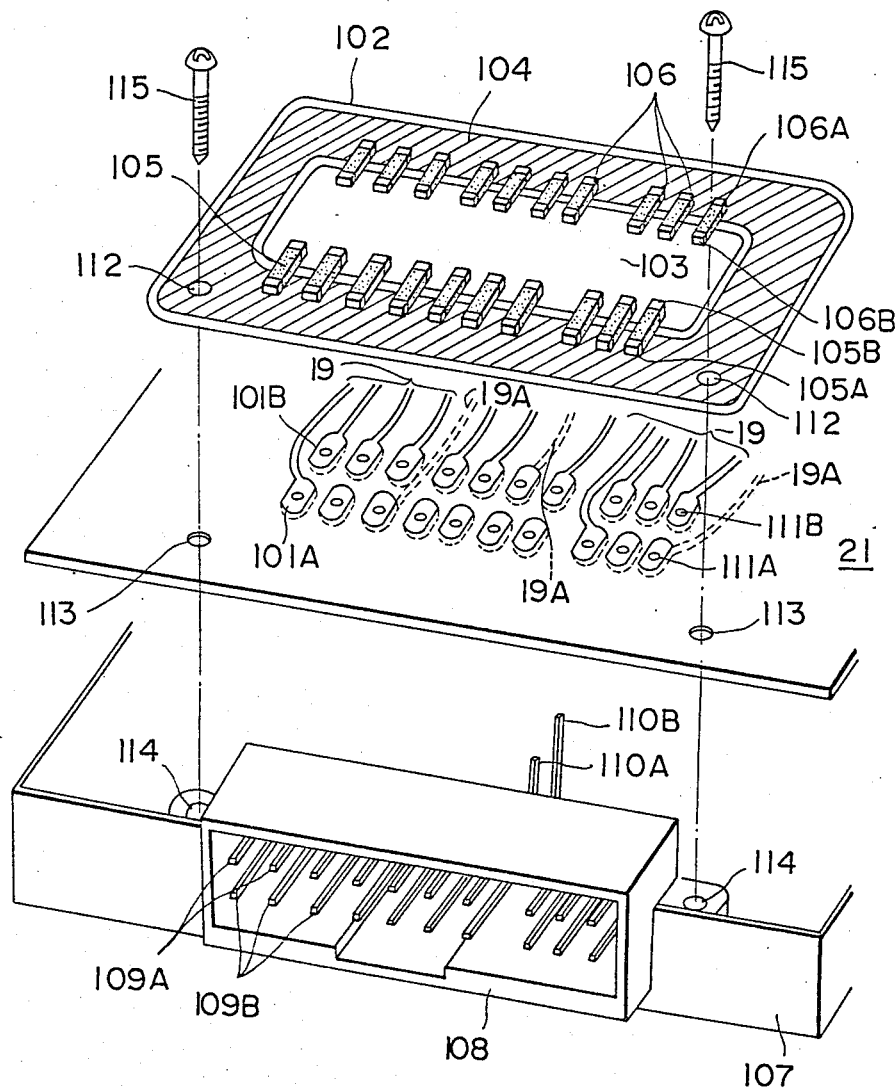
FIGS. 6 and 7 are perspective views showing an exploded view of a preferred embodiment of a noise interference preventing device according to the present invention.

FIG. 6 shows a preferred embodiment of the noise interference preventing device according to the present invention. In FIG. 6, numerals 19A and 19 denote printed metal foil patterns serving as the input/output signal lines printed, respectively on the upper and lower surfaces of the printed circuit board 21. Numerals 101A and 101B denote, so called, land patterns formed at an end of the respective printed metal foil patterns 19 and 19A. These land patterns 101A and 101B are disposed along two elongated lines on both surfaces of the printed circuit board 21 in the preferred embodiment shown in FIG. 6. Numeral 102 denotes an insulative sheet having a cavity 103 at the center thereof. Numeral 104 denotes a conductive film formed on an upper surface of the insulative sheet 102. When the conductive film 104 is formed, the insulative position is formed along both ends along an outer peripheral portion of the conductive film 104 and along an inner peripheral portion of the cavity 103. Numerals 105 and 106 denote chip-type ceramic capacitors provided along both edges of the cavity 103. Numerals 105A, 105B, 106A, and 106B denote electrodes at both ends of the capacitors 105 and 106. The chip-type capacitors 105 and 106 used as filter elements have preferably an electrostatic capacitance between 300 pf and 3,000 pf in order to obtain a favorable damping characteristic over a frequency band of FM and TV broadcasting range.

When each chip-type capacitor 105 and 106 is mounted on the conductive film 104, each one electrode 105A is superposed on the conductive sheet 104 and each one land pattern end 101A and each other electrode 105B is superposed on the each other land pattern end 101B. (refer to FIG. 7)

Electrical connection for these capacitors 105 and 106 is made in a soldering-bath treatment. Therefore, in the above-described step, these capacitors 105 and 106 are merely arranged and adhered to the conductive film 104. In this step, it is preferable to use an adhesive or bonding tape which can resist the heat generated in the soldering-bath treatment. Alternatively, it is good practice to mount a double sided bonding tape on one surface of which these capacitors 105 and 106 are adhered and arranged in place.

In FIG. 6, furthermore, numeral 107 denotes a metal casing for housing the printed circuit board 21 on which the arrangement described above is mounted. The metal casing 107 is electrically connected to the vehicle body 17 (refer to FIG. 2).

Numeral 108 denotes a connector attached on the metal casing 107 in which connector pins 109A and 109B are provided along upper and lower lines. It will denoted that each end 110A and 110B of the connector pins 109A and 109B is adapted so as to face against a through hole provided in the corresponding land pattern 101A and 101B.

After other circuit components (not shown) are attached on the printed circuit board 21, the insulative sheet 102 is fixed on the printed circuit board 21 and thereafter each end 110A and 110B of the connector pins 109A and 109B is fitted into each corresponding through hole 110A and 110B in combination with the metal casing 107.

In the subsequent soldering-bath treatment, electrical connections are made respectively between the capacitors 105 and 106 with the conductive film 104, the capacitors 105 and 106 with the land patterns 101A and 101B, and connector pin ends 110A and 110B with the land patterns 101A and 101B. Numeral 112 denotes a hole for inserting a screw 115 provided at each corner of one end of the conductive film 104. Similarly, numerals 113 and 114 denote hole and threaded hole provided respectively at the corners of the printed circuit board 21 and metal casing 107. Therefore, the conductive film 104 can be connected electrically to the vehicle body 17 through the screws 115.

Figure 7:
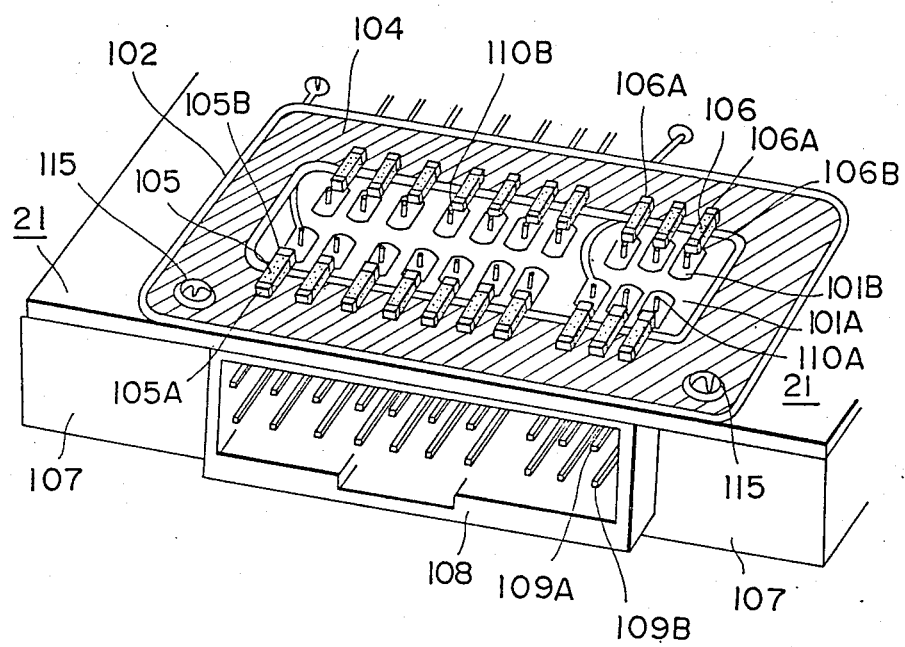

FIG. 7 illustrates a profile of the digital electronic apparatus constructed in such a way as described above.

As shown in FIG. 7, the capacitor filter elements 105 and 106 for bypassing high-frequency noise can compactly and orderly arranged within the metal casing 107 between the land patterns 101A and 101B via the conductive film 104.

In the noise interference preventing device for the digital electronic apparatus thus constructed, the chip-type laminated ceramic capacitors 105 and 106 as the filter elements work effectively against high-frequency noise components through their high-frequency bypass actions.

In addition, the conductive film 104 is connected electrically to the vehicle body via the screws 115 and metal casing 107 for preventing interference of the same-phase noise components between the input/output signal lines, ground lines 19, 19A and the vehicle body, so that a feedback ground loop is secured with a sufficiently low impedance for these noise components. In other words, the ground feedback loop can be shortened for these signal lines to filter the noise described above.

Figure 9:
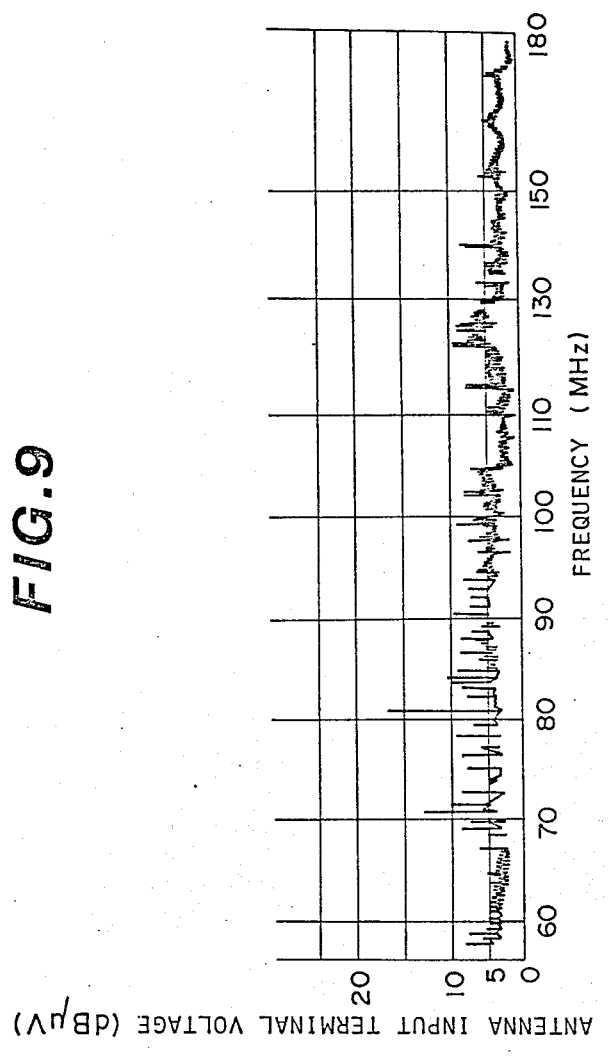
FIG. 9 is a frequency spectrum showing a measurement of the noise interference preventing device according to the present invention.

FIG. 9 shows experimental data of a digital electronic apparatus having a noise characteristic as shown by FIG. 3 wherein the noise interference preventing device according to the present invention is used. In this experiment, a field strength instrument (intermediate frequency band-width is 10 KHz) is used to measure noise when twenty ceramic capacitors are used as filter elements.

As shown in FIG. 9, a high peak voltage for each particular frequency disappears as compared with that shown in FIG. 3. Therefore, it will be seen that harmful noise affecting the audio equipment or apparatus itself is eliminated.

Figure 8:
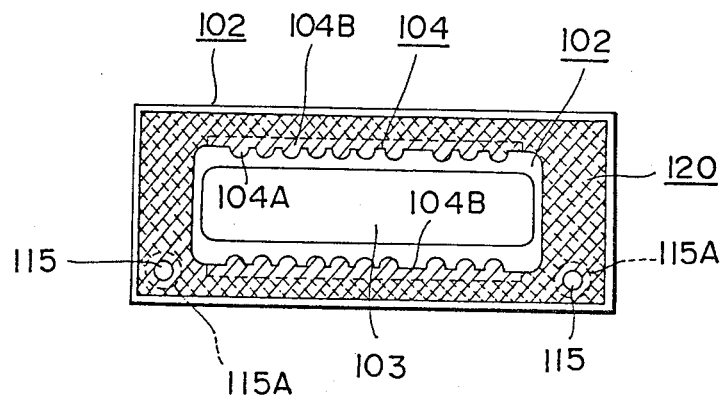
FIG. 8 is an elevated view showing a configuration of conductive films in another preferred embodiment of the noise interference preventing device according to the present invention.

FIG. 8 shows another preferred embodiment according to the present invention. In this preferred embodiment, a protective film is formed so as not to lose the flexibility of the conductive film 104 in the process of solder-bath treatment. In the preceeding step, the conductive film 104 is extended enough to connect to the electrodes 105A and 106A of the capacitors 105 and 106. Numeral 104A denotes an extended portion of the conductive film 104 at which the capacitors 105 and 106 are fixed extended toward the cavity 103. Numeral 120 denotes a range where a solder-resisting treatment is made so as not to be soldered. In other words, a range 104B where the capacitor electrodes 105A and 106A are attached, the periphery of the hole 115, the portion of the insulative sheet 102 not forming the conductive film 104 do not undergo the solder-resisting treatment.

In this way, soldering can be made only for portions where electrical connections are required. Consequently, the flexibility of the conductive film 104 can be maintained.

As described hereinabove, according to the present invention, to prevent the basic wave and high-frequency components of the clock pulse used in a digital electronic apparatus from being leaked externally through the input/output signal lines and power supply lines and to prevent the leaked noise from interferring with the reception of the audio equipment, the noise interference preventing device is provided with a conductive film formed so as to enclose the land patterns for connecting the connector pins with the input/output signal lines printed on the printed circuit board. The conductive film is connected to the metal casing of the digital electronic apparatus, and the connector pins are inserted into the through holes of the land patterns respectively from the lower surface. Furthermore chip type capacitors are buried between each land pattern and conductive film so as to be able to apply the noise interference preventing device easily to those printed circuit boards where printed metal foil patterns are formed on both upper and lower surfaces thereof. In addition, the order of assembly of the noise interference preventing device is simple and the device can be installed in a small space with a high noise filtering effect.

Faulty operation of the apparatus can be prevented due to the introduction of external noise, and such electromagnetic-wave disturbance as to cause a serious malfunction can be prevented.

Furthermore, according to the method of manufacturing such noise interference preventing device, the flexibility of the conductive film can be secured to increase the durability of the noise interference preventing device.

It will be fully appreciated by those skilled in the art that modifications can be made in the preferred embodiment described hereinbefore without departing the spirit and scope of the present invention, which is to be defined by the appended claims.

What is claimed is:

1. A device for preventing leakage of noise components of a clock pulse generator, comprising:
   (a) a metal casing;
   (b) a printed circuit board, housed within said metal casing, said clock pulse generator assembled on said printed circuit board and said printed circuit board having a plurality of land patterns provided at ends of various signal lines of said printed circuit board;
   (c) a connector attached at one end of said printed circuit board having a plurality of connector pins for connecting said land patterns with external apparatus;
   (d) an insulative member positioned on one surface of said printed circuit board closely adjacent said land patterns;
   (e) a conductive film coated on one surface of said insulative member and coupled electrically to said metal casing; and
   (f) a plurality of chip-type capacitors bridging said conductive film and said plurality of said land patterns.

2. A device for preventing leakage of noise as set forth in claim 1, which further comprises means for electrically connecting said conductive film to said metal casing.

3. A device for preventing leakage of noise as set forth in either claim 1 or 2, wherein said insulative member is an insulative sheet having a cavity at a center thereof for connecting directly one electrode of each of said chip-type capacitors to one of said corresponding land pattern.

4. A device for preventing leakage of noise as set forth in claim 1, wherein said chip-type capacitors are laminated ceramic capacitors each having a capacitance ranging from 300 to 3,000 picofarads.

5. A device for preventing leakage of noise as set forth in claim 3, wherein said conductive film is coated on said insulative sheet so as to form a plurality of extended portions thereof along the periphery of the cavity to which each other electrode of said chip-type capacitors is connected.

6. A device for preventing leakage of noise as set forth in claim 5, wherein a solder-resisting treatment is made for said conductive film except the extended portions.

7. A device for preventing basic frequency and higher harmonic components generated from a digital processing system operated upon a clock pulse from being propagated externally, the digital processing system being constructed on a printed circuit board, comprising:
   (a) a metal casing which encloses the printed circuit board;
   (b) a plurality of land patterns provided on both surfaces of the printed circuit board at which various signal lines including input/output signal lines and ground lines of the digital processing system are terminated;
   (c) a connector having a plurality of connector pins for connecting said land patterns to other electrical devices associated with the digital-processing system;
   (d) a flat insulative member positioned on one surface of the printed circuit board so as to surround said land patterns and having a conductive film coated on one surface of said insulative member and coupled electrically to said metal casing so that in-phase noise components between the input/output signal lines and ground lines of the digital processing system and ground are attenuated; and
   (e) a plurality of capacitors, one electrode of each capacitor being connected to one of said land patterns and another electrode of each capacitor being connected to said conductive film for bypassing the basic frequency and higher harmonic frequency components generated from the digital processing system.

8. The device according to claim 7, wherein said land patterns are arranged in at least one row along the printed circuit board and said chip-type capacitors are accordingly arranged in a row.

9. An apparatus for preventing basic frequency and higher harmonic components generated from a microcomputer in a digital processing system from being propagated externally out of the digital processing system, the microcomputer being mounted within an automotive vehicle and constructed on a printed circuit board, comprising;
   (a) a metal casing which encloses the printed circuit board and is electrically connected to the vehicle body;
   (b) a plurality of land patterns provided on both surfaces of the printed circuit board at which various signal lines including input/output signal lines and ground lines of the microcomputer are terminated;
   (c) a connector having a plurality of connector pins, each of said connector pins having one end inserted through a corresponding one of said land patterns for connecting said land patterns to other electrical devices located within the vehicle and associated with the microcomputer;

(d) a flat insulative member positioned on one surface of the printed circuit board so as to surround said land patterns and having a conductive film coated on one surface of said insulative member and coupled electrically to said metal casing so that in-phase noise components between the input/output signal lines and ground lines of the microcomputer and vehicle body are attenuated; and (e) a plurality of chip-type capacitors, one electrode of each chip-type capacitor being connected to one of said land patterns and the other electrode thereof being connected to said conductive film for bypassing the basic frequency and higher harmonic frequency components generated from the microcomputer to the vehicle body.

10. A method of manufacturing a device for preventing leakage of noise components of a clock pulse generator comprising the steps of:

(a) coating a solder-resisting film on a conductive film except a portion to which a plurality of electrodes of chip-type capacitors are connected and a portion to which a metal casing for housing a printed circuit board is electrically connected;

(b) electrically connecting said conductive film to said plurality of chip-type capacitors and electrically connecting said plurality of chip-type capacitors to land patterns on said printed circuit board in a solder bath treatment so as to electrically bridge said conductive film and land patterns; and (c) electrically connecting said conductive film to said metal casing.

* * * * *